United States Patent
He et al.

(10) Patent No.: US 10,658,210 B2
(45) Date of Patent: May 19, 2020

(54) APPARATUS AND METHOD FOR DETECTING OVERLAY MARK WITH BRIGHT AND DARK FIELDS

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Shifeng He, Shanghai (CN); Qiang Wu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 31 days.

(21) Appl. No.: 15/797,891

(22) Filed: Oct. 30, 2017

(65) Prior Publication Data

US 2018/0122668 A1 May 3, 2018

(30) Foreign Application Priority Data

Oct. 31, 2016 (CN) .......................... 2016 1 0929499

(51) Int. Cl.
*H01L 21/67* (2006.01)
*H01L 21/68* (2006.01)
(Continued)

(52) U.S. Cl.
CPC .... *H01L 21/67259* (2013.01); *G03F 7/70633* (2013.01); *H01L 21/681* (2013.01);
(Continued)

(58) Field of Classification Search
CPC ............. H01L 21/67259; H01L 21/681; G03F 7/70633; G01L 23/544
See application file for complete search history.

(56) References Cited

U.S. PATENT DOCUMENTS 4,710,026 A * 12/1987 Magome ............. G03F 7/70633
356/400
4,907,157 A * 3/1990 Uyama ................ G01N 23/046
378/11

(Continued)

FOREIGN PATENT DOCUMENTS

| CN | 103777467 A | 5/2014 |
|---|---|---|
| CN | 103969960 A | 8/2014 |
| EP | 2458441 | 5/2012 |

OTHER PUBLICATIONS

European Application No. 17198880.1, Extended European Search Report dated May 29, 2018, 9 pages.
(Continued)

*Primary Examiner* — Hina F Ayub
(74) *Attorney, Agent, or Firm* — Kilpatrick Townsend & Stockton LLP

(57) ABSTRACT

An apparatus for detecting a mark on a substrate is provided. The mark has a first stripe group and a second stripe group disposed in parallel to each other. The apparatus includes a detection module operative to move over a surface of the substrate. The detection module includes a detection unit for obtaining data from the mark and operative to perform repeated acquisition operations on the first stripe group and the second stripe group of the mark. Each of the acquisition operations acquires data associated with the first stripe group or the second stripe group of the mark. The detection module also includes a positioning unit for aligning the detection unit with the mark.

17 Claims, 6 Drawing Sheets

(51) Int. Cl.
*G03F 7/20* (2006.01)
*H01L 23/544* (2006.01)

(52) U.S. Cl.
CPC .. *H01L 23/544* (2013.01); *H01L 2223/54413* (2013.01); *H01L 2223/54426* (2013.01)

(56) References Cited

U.S. PATENT DOCUMENTS

| | | | | |
|---|---|---|---|---|
| 5,559,598 | A * | 9/1996 | Matsumoto | G03F 7/70633 356/490 |
| 5,783,342 | A * | 7/1998 | Yamashita | G03F 9/70 356/511 |
| 6,079,256 | A | 6/2000 | Bareket | |
| 6,921,946 | B2 | 7/2005 | Tao et al. | |
| 6,967,709 | B2 | 11/2005 | Mellinger et al. | |
| 2003/0165265 | A1 * | 9/2003 | Kurosawa | G03F 7/70725 382/145 |
| 2012/0057159 | A1 * | 3/2012 | Deckers | G03F 1/42 356/401 |
| 2015/0184729 | A1 * | 7/2015 | Jeng | G01L 5/0033 74/424.82 |
| 2016/0290787 | A1 * | 10/2016 | Ding | H01L 21/6734 |
| 2018/0246420 | A1 * | 8/2018 | Pandey | G03F 7/70666 |

OTHER PUBLICATIONS

Chinese Application No. 201610929499.3, Office Action dated Aug. 23, 2019, 5 pages.

* cited by examiner

APPARATUS AND METHOD FOR DETECTING OVERLAY MARK WITH BRIGHT AND DARK FIELDS

CROSS-REFERENCES TO RELATED APPLICATIONS

This application claims priority to Chinese patent application No. 201610929499.3, filed on Oct. 31, 2016, the content of which is incorporated herein by reference in its entirety.

FIELD OF THE INVENTION

The present invention relates generally to semiconductor technology. More particularly, embodiments of the present invention relate to an apparatus and method for detecting a mark on a substrate.

BACKGROUND OF THE INVENTION

Conventional overlay measurement devices rely on an optical imaging device to measure the relative positional deviation between two sets of marks. Since an optical imaging device usually has optical distortion, it is generally necessary to first move the marks to the center of the field of view of the optical imaging device and then detect the relative deviation between the positions of the two sets of marks using image recognition techniques, thereby eliminating the effect of optical distortion on the measurement results.

FIGS. 1A and 1B are plan views of a schematic representation of two sets of marks at the center of the field of view of an optical imaging device, as known in the art. As shown in FIGS. 1A and 1B, the position of a mark 102A in the current layer in the X-direction and the position of an etched mark 102B in a previous layer in the Y-direction can be measured using image recognition techniques so that the relative deviation of the positions between the two sets of marks can be determined.

However, in the process of placing the marks to the center of the field of view of the optical imaging device, there may be an error due to the placement of the substrate on which the marks are disposed, therefore, it is generally necessary to fine tune the placement to place the marks to the center of the field of view, and the process is time consuming. Further, there is also a time required to identify the scanned image, so that it takes a relatively long time to measure a set of marks (e.g., 0.5-1 second).

With ever decreasing size in technology nodes, the requirements for the set of measurements also increase and more sets of marks need to be measured. For example, if more than 60 exposure areas of a wafer are required to be measured, and assuming that each exposure area has five sets of marks, the measurement time will take about 5 minutes.

Thus, there is a need for a novel measurement apparatus and method to reduce the measurement time of the marks.

BRIEF SUMMARY OF THE INVENTION

The present disclosure describes various embodiments that relate to devices, systems, and methods for cost effectively and time efficiently detecting marks on a substrate.

In one embodiment, an apparatus for detecting a plurality of marks on a substrate is provided. Each of the marks has a first stripe group and a second stripe group spaced apart from each other and disposed in parallel to each other. The apparatus may include at least one detection module moveable over a surface of the substrate along a first direction. The at least one detection module may include at least one detection unit configured to obtain data from a mark and operative to perform repeated acquisition operations on the first stripe group and the second stripe group of the mark, each of the acquisition operations is configured to acquire data associated with the first stripe group or the second stripe group of the mark, and at least one positioning unit configured to align the at least one detection unit with the mark in the first direction.

In one embodiment, the first stripe group includes a plurality of first stripes, and the second stripe group includes a plurality of second stripes. The first and second stripes are spaced apart from each other and disposed in parallel to each other along the first direction. In one embodiment, the first stripes and the second stripes are alternately arranged with each other.

In one embodiment, the apparatus may further include a data processing module configured to determine a positional deviation between the first and second stripe groups based on data obtained from the first and second stripe groups.

In one embodiment, the obtained data includes a peak light intensity received from the first stripe group or from the second stripe group and a time associated with the received peak light intensity.

In one embodiment, the plurality of marks may include a plurality of columns of marks arranged along the first direction; the at least one detection unit includes a plurality of detection units; the at least one positioning unit includes a plurality of positioning units. Each of the positioning units is operative to align one of the detection units with a corresponding mark along the first direction.

In one embodiment, the at least one detection module further includes a frame; the at least one positioning unit includes at least one support rod mounted to the frame and configured to support the at least one detection unit; and a positioning mechanism configured to move the at least one detection unit along the at least one support rod to a desired position to align the at least one detection unit with a mark.

In one embodiment, the at least one support rod includes a screw bar, and the positioning mechanism moves the at least one detection unit along the screw bar. In one embodiment, the at least one detection unit includes a first hole and a second hole disposed vertically and a third hole disposed between the first and second holes, the third hole having internal threads, and the screw rod having external threads for engaging the internal threads of the third hole. The frame includes a first bracket and a second bracket disposed opposite to each other. The at least one support rod includes a first support rail passing through the first hole and a second support rail passing through the second hole and suspended between the first and second brackets. The screw rod passes through the third hole and drives the at least one detection unit along the first and second support rails when rotating.

In one embodiment, the apparatus further includes an air cushion guide, and the air cushion guide includes a first rail extending in the first direction; a first slider engaged with the first rail and configured to support the first bracket; a second rail extending in the first direction; and a second slider engaged with the second rail and configured to support the second bracket. The first slider, when moving along the first rail, drives the first bracket along the first direction, and the second slider, when moving along the second rail, drives the second bracket along the first direction, so that the detection module moves above the surface of the substrate in the first direction.

In one embodiment, the frame further includes a third bracket engaged with a first end of the first bracket and a first end of second bracket; and a fourth bracket opposite the third bracket and engaged with a second end of the first bracket and a second end of the second bracket.

In one embodiment, the marks are disposed in a scribe line extending along the first direction. The marks are configured such that, when a placement error of the substrate is a first error, and a misalignment of a center of a field of view of the at least one detection unit with respect to an ideal center axis of the scribe line is a second error, the at least one detection unit is configured to obtain the data from the marks disposed in the scribe line.

In one embodiment, the at least one detection unit includes an optical image detection system. The optical image detection system includes a light source for generating light; a lens configured to converge the light generated by the light source to irradiate the marks; a semi-reflective mirror configured to reflect at least one portion of the light toward the lens to irradiate the marks and transmit at least one portion of the light emitted by the irradiated marks through the lens; and a transducer configured to receive the emitted portion of the light by the irradiated marks through the lens by the semi-reflective mirror and convert the received light into an electrical signal.

In one embodiment, the at least one detection unit includes an optical image detection system, which includes a lens for converging light emitted from the marks; a transducer for receiving light from the lens and converting the received light into an electrical signal; and a light source for generating a first light beam and a second light beam. The optical image detection system also includes a first light generating member disposed on one side of the optical image detection system for generating a first light and having a first mirror for reflecting the first light beam; a first lens for converging the first light beam reflected by the first mirror to generate a converged first light beam; a second mirror for reflecting the converged first light beam to be incident onto the mark at a first oblique angle. The optical image detection system also includes a second light generating member disposed on one side of the optical detection image system for generating a first light and having a third mirror for reflecting the second light beam; a second lens for converging the second light beam reflected by the third mirror to generate a converged second light beam; and a fourth mirror for reflecting the converged second light beam to be incident onto the mark at a second oblique angle.

In one embodiment, the at least one detection unit further includes a data acquisition module for acquiring the electrical signal of the transducer and sending the acquired electrical signal to a data processing device for processing.

In one embodiment, the marks are etched marks, and the first stripe group includes marks of a current layer, and the second stripe group includes marks of a previous layer.

In one embodiment, the at least one detection module uniformly accelerates or uniformly decelerates over the surface of the substrate in at least one direction.

In one embodiment, the apparatus further includes a substrate support platform for supporting the substrate. In one embodiment, the apparatus also includes a vibration-proof platform for supporting the substrate support platform.

Embodiments of the present disclosure also provide a method for detecting a mark on a substrate. The mark includes a first stripe group and a second stripe group arranged in parallel to each other. The method may include providing a detection module having a detection unit and a positioning unit disposed over a surface of the substrate, the detection module configured to move over the surface of the substrate in a first direction to obtain data of the mark, aligning the detection unit with the mark by the positioning unit, and operating the detection module to detect the mark The following description, together with the accompanying drawings, will provide a better understanding of the nature and advantages of the claimed invention.

BRIEF DESCRIPTION OF THE DRAWINGS

The accompanying drawings form a part of the present disclosure, that describe exemplary embodiments of the present invention. The drawings together with the specification will explain the principles of the invention.

DETAILED DESCRIPTION OF THE INVENTION

Figure 1A:
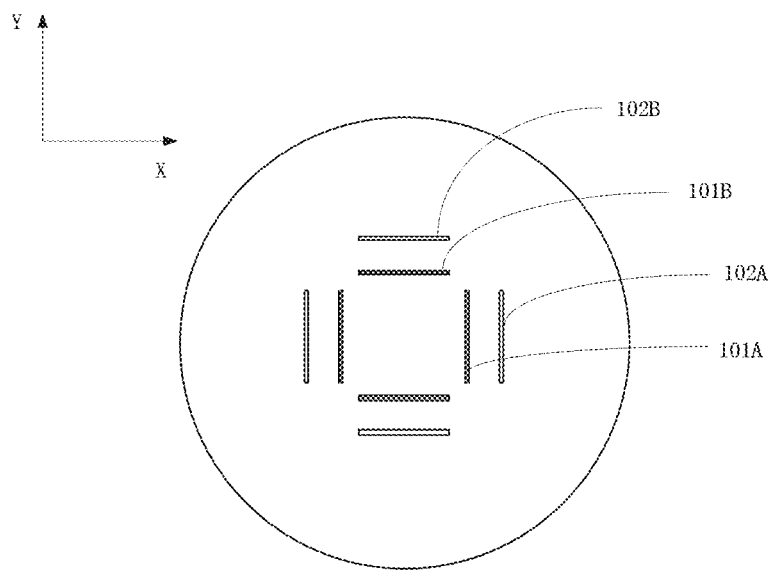
FIGS. 1A and 1B are plan views of a schematic representation of two sets of marks at the center of the field of view of an optical imaging device, as known in the art.
Figure 1B:
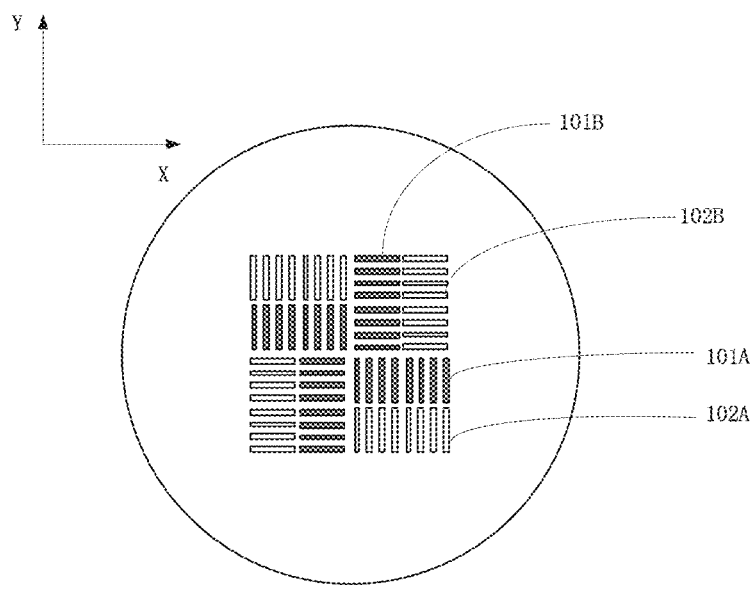

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It will be understood that the drawings are not drawn to scale, and similar reference numbers are used for representing similar elements. Embodiments of the invention are described herein with reference to functional block diagrams that are schematic illustrations of idealized embodiments (and intermediate structures) of the invention.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

It should be noted that the reference numerals and letters denoted similar items in the accompanying drawings, and therefore, once an item is defined in a drawing, its description will not be repeated in drawings that follow.

Embodiments of the present disclosure provide a method for detecting marks without relying upon an optical imaging device that performs an imaging operation of the marls. In this way, the requirement on the lens is relatively low, and a conventional optical detection system can be used to detect the marks. The method according to embodiment of the present disclosure not only reduces the detection time of the marks, but also lowers the cost of test equipment (e.g., marking device).

Figure 2:
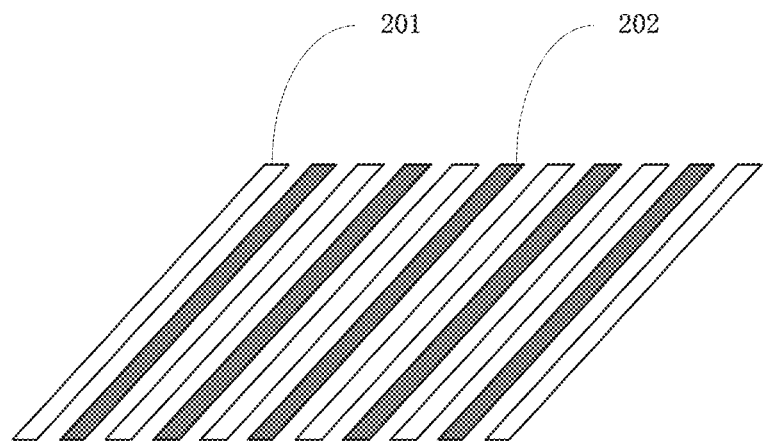
FIG. 2 is a perspective view illustrating a mark on a substrate according to one embodiment of the present disclosure.

FIG. 2 is a perspective view of a mark on a substrate according to one embodiment of the present disclosure. As shown in FIG. 2, the mark on the substrate may include a plurality of first stripes (first stripe group) 201 and a plurality of second stripes (second stripe group) 202 that are substantially parallel to each other and spaced apart from each other. In one embodiment, first stripes 201 may be the marking stripes of the current layer, and second stripes 202 may be the marking stripes of a previous layer. That is, first stripes 201 may be formed in a first layer, and second stripes 202 may be formed in a second layer that is different from the first layer. Thus, it is understood that, although the first and second stripes are shown to be substantially flush for the convenience of illustration in FIG. 2, the first and second stripes can be disposed in different levels in certain embodiments. Illustratively, first stripes 201 and second stripes 202 may be a concave-convex pattern formed in corresponding layers. Further, in some embodiments, the first and second stripes may be configured to have different properties. In one example embodiment, the first and second stripes may be configured to have different surface reflectivity, such that one of the first and second stripes has a relatively smooth surface and the other one of the first and second stripes has a relatively rough surface. In another example embodiment, the first and second stripes may be configured to have different surface heights. It is to be understood that these are merely examples in order to better understand the various embodiments of the disclosure and are not intended to limit the scope of the disclosure, as long as the difference between the first and second stripes is distinguishable using any technical means (e.g., through information or data obtained from the stripes). In some other embodiments, each of the marks on the substrate may include a first group of stripes (a first stripe group) spaced apart from each other and a second group of stripes (a second stripe group) spaced apart from each other, as shown in FIG. 2. Herein, the first group of stripes (the first stripe group) may include a plurality of first stripes adjacent to each other, and the second group of stripes (the second stripe group) may include a plurality of second stripes adjacent to each other. The first group of stripes and the second group of stripes are arranged parallel to each other along a certain direction. In one embodiment, first stripes 201 and second stripes 202 are disposed alternatively to each other, however, the present disclosure is not limited thereto.

Figure 3:
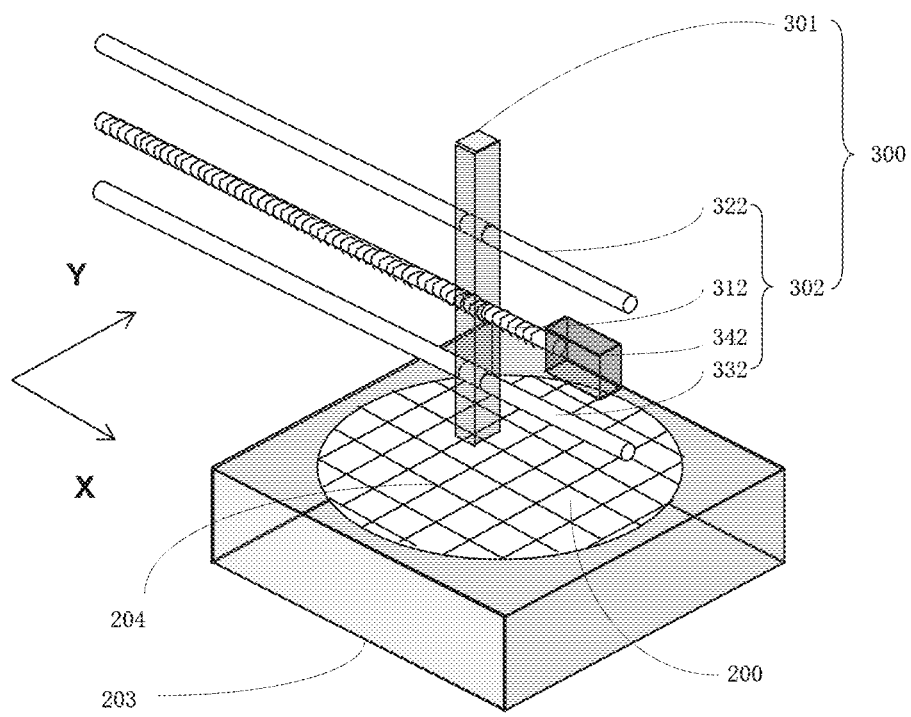
FIG. 3 is a perspective view illustrating a structure of an apparatus for detecting a mark on a substrate according to one embodiment of the present disclosure.

FIG. 3 is a perspective view illustrating an apparatus for detecting a mark on a substrate 200 according to an embodiment of the present disclosure. For the sake of convenience of description, the term "an apparatus for detecting a mark on a substrate" is alternatively referred to as "a detection apparatus" or "a detection device" hereinafter. The mark on the surface of substrate 200 may include the stripes described above. Referring to FIG. 3, the detection apparatus (detection device) may include at least one detection module 300. Detection module 300 is configured to be moveable over the surface of substrate 200 along at least one direction (e.g., along the Y-direction). In some embodiments, the detection apparatus may include two detection modules, one of which is configured to be moveable over the surface of substrate 200 along the X-direction, the other one is configured to be moveable over the surface of substrate 200 along the Y-direction. Substrate 200 is shown as being supported by a substrate support platform 203. Substrate support platform 203 may be any suitable platform for supporting or carrying a substrate known in the art or developed in the future.

Detection module 300 may include at least one detection unit 301 and at least one positioning unit 302. Detection unit 301 is configured to obtain information (data) of a corresponding mark (e.g., as shown in FIG. 2). In the example embodiment shown in FIG. 3, one or more marks may be located in a track 204. Track 204 may be a scribe line of a semiconductor wafer, the mark may be an alignment mark imprinted on or etched into the scribe line. Track 204 is shown to be extending along the X-direction and/or the Y-direction. It should be understood that track 204 is merely an example, those of skill in the art will appreciate that track 204 may not be present or a virtual straight line.

Detection unit 301 is configured to perform repeated acquisition operations on a first stripe group (i.e., first stripes 201) and a second stripe group (i.e., second stripes 202) of a corresponding mark. Each acquisition operation may obtain information (data) of the first stripe group or the second stripe group of the corresponding mark. In one embodiment, the obtained information (data) may include at least one of the peak light intensity received from the first stripe group or the second stripe group and the time at which the peak light intensity is received.

Positioning unit 302 is configured to support and position a corresponding detection unit 301. Positioning unit 302 is configured to operate such that corresponding detection unit 301 is substantially aligned with a corresponding mark in the X or Y direction of the detection module. Positioning unit 302 will be described in more detail later below.

According to the present disclosure, the detection unit may be substantially aligned with a corresponding mark to be detected by the positioning unit so that the detection module moves above the substrate using the detection unit for detecting the mark on the substrate. The method for detecting the mark does not depend from an optical imaging approach, and thus, there is no need to move the mark to the center of the field of view of the optical imaging lens and there is no need for a fine tuning operation, and there Is no need to identify the optical image, that reduces the detection time of the mark, and there is no need for a very precision alignment accuracy required in the prior art. Thus, the cost of mark detection is reduced, and the efficiency of the mark detection and the throughput of the detection apparatus are improved.

Further, in some embodiments, the detection apparatus may also include a data processing module connected to the detection module using a wired or wireless communication connection to determine the positional deviation between the first stripe group and the second stripe group according to data obtained from the first stripe group and the second stripe group. The data processing module may be integrated in the detection apparatus (e.g., in the form of a processor) or it may be implemented as a separate component or device coupled to the detection apparatus using a wired or wireless communication link.

Figure 4:
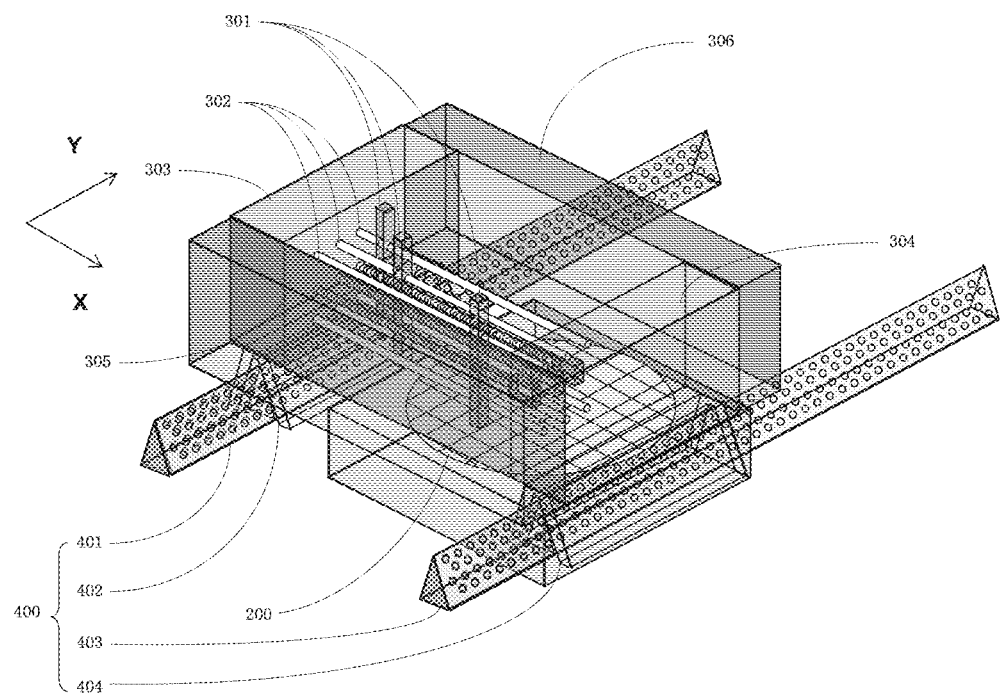
FIG. 4 is a perspective view illustrating a structure of an apparatus for detecting a mark on a substrate according to another embodiment of the present disclosure.

FIG. 4 is a perspective view illustrating a structure of an apparatus for detecting a mark on a substrate according to another embodiment of the present disclosure. In the embodiment, substrate 200 may include a plurality of columns of marks arranged along a certain position (e.g., the Y direction). Each column of marks may include a plurality of first stripes (first stripe group) 201 that are arranged in parallel and spaced apart from each other and a plurality of second stripes (second stripe group) 202 that are arranged in parallel and spaced apart from each other (as shown in FIG. 2). Detection module 300 may include a plurality of detection units 301 and a plurality of positioning units 302. Each positioning unit 302 is operative to align a corresponding detection unit 301 with a corresponding mark along the direction of the motion of the detection unit/module (e.g., in the Y direction as shown in FIG. 4).

In the embodiment, the detection unit may be aligned with a column of marks by the positioning unit so that detection module 300 can detect multiple columns of marks when moving over the surface of the substrate along the Y direction to further reduce the detection time and improve the detection efficiency.

It is understood that, although three detection units 301 and three positioning units 302 are shown in FIG. 4, this is merely illustrative and is not intended to limit the scope of the present disclosure. In practical applications, the number of detection units and positioning units can be determined according to actual requirements.

The detection apparatus may include a plurality of detection modules, for example, two detection modules. One of the detection modules is operative to detect one or more marks in a certain direction (e.g., the Y direction), and the another one of the detection modules is operative to detect one or more marks in another direction (e.g., the X direction). In the case where a plurality of columns of marks are arranged in both the X direction and the Y direction, one scanning operation in the X direction may detect all of the marks arranged in the X direction, and one scanning operation in the Y direction may detect all of the marks arranged in the Y direction. If the scanning speed is 1 m/s, the time to scan a 300 mm substrate is only slightly greater than 0.3 seconds. The time to completely scan the marks arranged in both X and Y directions is about 1 second, thus, the time of detecting all the marks of the substrate is greatly reduced.

In one embodiment, referring to FIG. 4, detection module 300 may also include a frame. The detection unit and the positioning unit may be directly or indirectly mounted on or supported by the frame. In one embodiment, the frame may include a first bracket 303 and a second bracket 304 disposed opposite to each other. In another embodiment, the frame may include first bracket 303, second bracket 304, a third bracket 305, and a fourth bracket 306. Third bracket 305 and fourth bracket 306 are disposed opposite to each other and arranged in a certain direction (e.g., the Y direction). Third bracket 305 is engaged with a first end of first bracket 303 and a first end of second bracket 304, and fourth bracket 306 is engaged with a second end of first bracket 303 and a second end of second bracket 304. The first ends and the second ends of the first and second brackets are opposite to each other. The frame is configured to increase the weight of the detection device, thereby increasing the inertia of the detection device in motion, and to secure the positioning unit to a support rod (that will be described in detail later below).

Referring still to FIG. 4, the detection device may also include an air cushion guide 400. Air cushion guide 400 may include a first rail 401, a first slider 402, a second rail 403, and a second slider 404. First rail 401 and second rail 402 extend in the same direction (e.g., the Y direction). First slider 402 is engaged with first rail 401 (e.g., disposed on first rail 401) to support first bracket 303. Second slider 404 is engaged with second rail 403 (e.g., disposed on second rail 403) to support second bracket 304. First slider 402 and second slider 404 are configured to slide along first rail 401 and second rail 402. When first slider 402 and second slider 404 are driven to slide along first rail 401 and second rail 402, they move first bracket 303 and second bracket 304 in a certain direction (e.g., the Y direction) so that detection module 300 can move over the surface of substrate 200 in the certain direction and detect marks disposed in that direction. In one embodiment, detection module 300 is operative to move with a uniform acceleration and a uniform deceleration.

Figure 5:
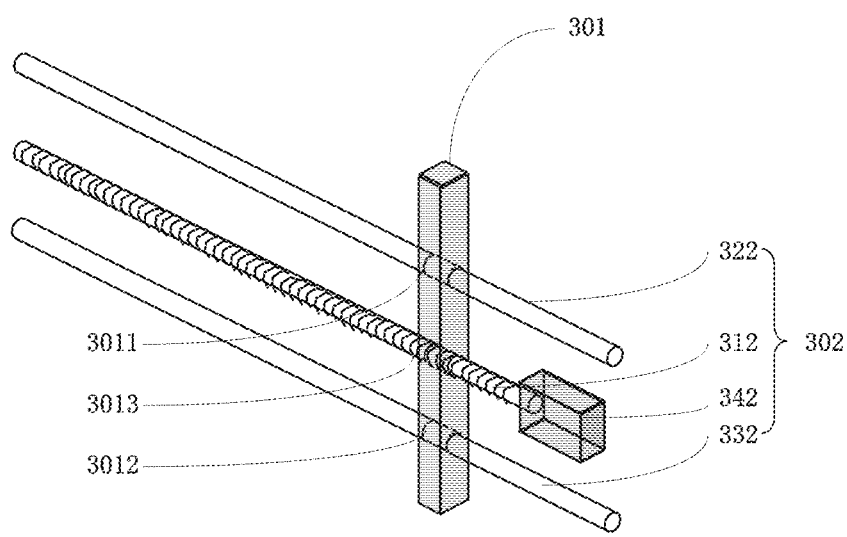
FIG. 5 is a perspective view illustrating a structure of a detection unit and a positioning unit according to one embodiment of the present disclosure.

FIG. 5 is a perspective view illustrating a structure of a detection unit and a positioning unit according to one embodiment of the present disclosure. Referring to FIG. 5, positioning unit 302 may include at least one support rod and a positioning mechanism 342. The support rod may be mounted or partially mounted on the frame (e.g., on the first bracket and/or the second bracket) and configured to support corresponding detection unit 301. Positioning mechanism 342 is configured to drive detection unit 301 along the support rod that secures the detection unit in a desired position so that the detection unit is aligned with a corresponding mark in a certain direction (e.g., the Y direction). In one embodiment, the support rod may include a screw rod 312, and positioning mechanism 342 may drive screw rod 312 to position and align detection unit 301 with a mark. In one embodiment, positioning mechanism 342 may be a rotating motor that can drive the screw rod to properly position detection unit 301.

In practical applications, the detection unit and the positioning unit may be implemented using different approaches so that the positioning unit can cause the corresponding detection unit to be aligned with a corresponding mark in a certain direction (e.g., the Y direction).

In one embodiment, detection unit 301 may include a first hole 3011 disposed in a first positon and a second hole 3012 disposed in a second portion that is arranged vertically with respect to the first position, and a third hole 3013 disposed between first hole 3011 and second hole 3012. As shown in FIG. 5, third hole 3013 has an internal thread, and screw rod 312 has an external thread engaging the internal thread of third hole 3013. In the embodiment, the frame may include first bracket 303 and second bracket 304 opposite to each other (shown in FIG. 4). The support rod may include screw rod 312, a first support rail 322, a second support rail 332, and positioning mechanism 342. First support rail 322 and second support rail 332 pass through respective first hole 3011 and second hole 3012 and suspended between first bracket 303 and second bracket 304. In one embodiment, first support 322 and second support rail 332 may be engaged with detection unit 301 using a sliding bearing so that detection unit 301 can be moved along the support rail. Screw rod 312 passes through third hole 3013 so as to enable detection unit 301 to move along first support rail 322 and second support rail 332 when screw rod is rotated to cause detection unit 301 to align with a corresponding mark in a certain direction (e.g., the Y direction).

Figure 6:
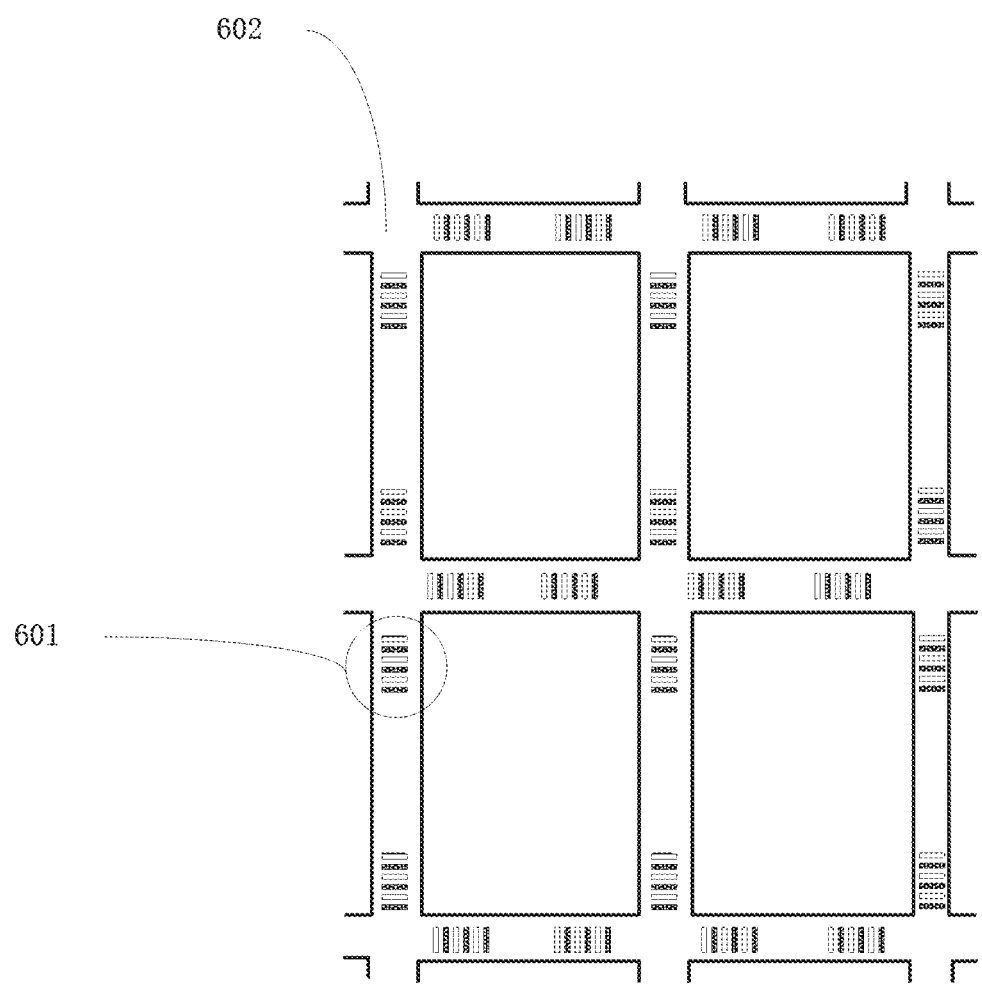
FIG. 6 is a plan view of a set of marks in a scribe line according to one embodiment of the present disclosure.

FIG. 6 is a plan view of one or more marks 601 in a scribe line according to one embodiment of the present disclosure.

Referring to FIG. 6, one or more marks 601 may be provided on a substrate such as in a scribe line 602 in the Y direction. Scribe line 602 may extend along the X direction and/or the Y direction. Marks 601 may be any of the above-described marks, e.g., each of the marks may include the first stripe group having a plurality of first stripes and the second stripe group having a plurality of second stripes, as shown in FIG. 2. In the embodiment, marks 601 may be configured such that, when an error on the substrate is a first error, and a misalignment error of the center of the field of view of the detection unit with respect to the ideal center axis of scribe line 602 is a second error, the detection unit can be configured to obtain data from the marks disposed in the scribe line. It is appreciated that, marks 601 may include a plurality of marks disposed in the Y direction or in the X direction, and each of the marks may include the first stripe group and the second stripe group.

In one exemplary embodiment, the scribe line has a width of 70 μm, the substrate placement error is 15 μm, the adjustment accuracy of the screw rod is 10 μm, the width of the field of view is 20 μm, the width of the mark may be set to the range between 40 μm and 70 μm. In this way, when the detection apparatus is operative to detect the mark, only the detection unit is positioned within the adjustment accuracy error, and all the marks in the corresponding scribe lines can be detected in one scanning operation. Thus, it is only necessary to perform a relatively coarse alignment to perform efficient measurements without the need for precise alignment as required in the prior art approach, thereby greatly reducing the mark detection time, improving the detection efficiency and reducing the equipment accuracy requirements to reduce the equipment cost.

With regard to the marks, some of the marks may have defects, e.g., undesirable particles or dust are present on the surface of the marks. In practical applications, the detection apparatus may be equipped with different types of detection units to detect defects of the marks or to prevent adverse effects of the mark defects on the detection. As an example, two structures of the detection unit will be described below.

Figure 7:
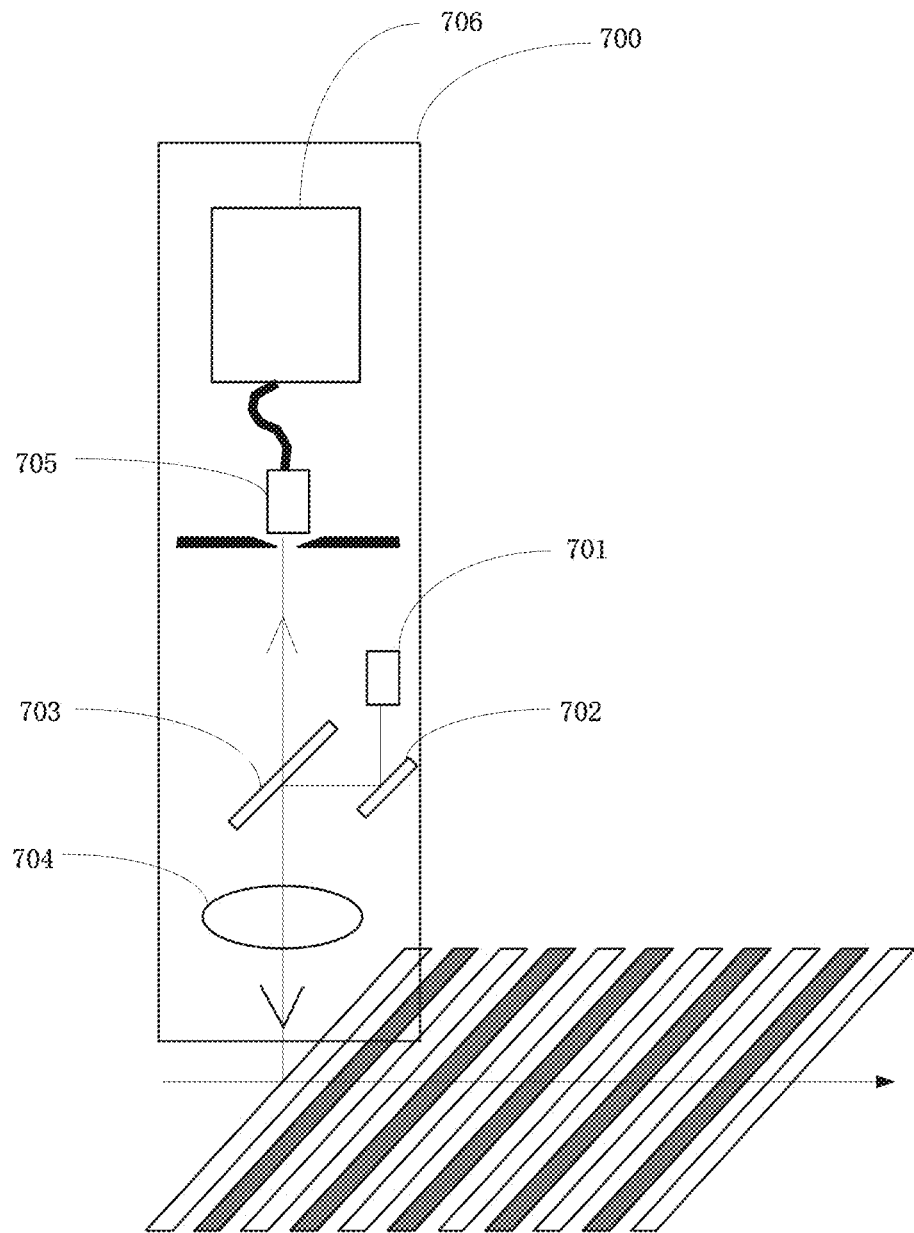
FIG. 7 is a side view in partial cross section of a structure of an optical image detection device according to one embodiment of the present disclosure.

FIG. 7 is a schematic view of a structure of a detection unit according to one embodiment of the present disclosure. Referring to FIG. 7, the detection unit may include an optical detection system 700. In one embodiment, optical detection system 700 may include a light source 701, an optional mirror 702, a semi-transparent and semi-reflective mirror (alternatively referred to as beam splitter or semi-reflective mirror hereinafter) 703, a lens 704, and a transducer (e.g., a photodiode) 705. Light source 701 may be, for example, a light emitting diode for generating light. Optional mirror 702 is configured to reflect light generated by light source 701. Semi-reflective mirror (beam splitter) 703 is configured to reflect at least one portion of light (e.g., light reflected by mirror 702) generated by light source 701 toward lens 704 to irradiate a mark on the substrate (shown as first and second stripes 201 and 202) and at least one portion of light emitted by the irradiated mark through lens 704. Lens 704 is configured to converge light from semi-reflective mirror 703 toward the irradiated mark and converge light emitted from the marks toward semi-reflective mirror 703 as an optical signal. Transducer 705 is configured to receive the optical signal through semi-reflective mirror 703 and convert the received optical signal into an electrical signal.

In one embodiment, the detection apparatus may further include a data acquisition module 706 coupled to transducer 705 and configured to acquire or obtain the electrical signal of the transducer and provide the acquired or obtained electrical signal to a processing device for processing.

The detection unit shown in FIG. 7 may be used to irradiate the detection field with light (illuminating the detection field), and the detection unit can be moved along the horizontal direction indicated by an arrow (horizontal arrow facing to the right). In general, for illuminating the detection field, light reflected of the surface of the irradiated mark back to the optical detection system has a relatively high light intensity, so that the field of view is generally well illuminated. The illuminated detection field can recognize marks based on the reflected light received from the surface of the mark. For marks that have no defects, light incident vertically to the marks will be substantially (or the majority of it) reflected back toward transducer (e.g., photodiode) 705, so that the detection unit can detect the marks based on the reflected light.

If the marks have defects, light incident onto the marks will be scattered, and the light intensity of the reflected light from the marks is relatively weak, so that defects of the marks can be detected. However, in this case, the presence of defects in the marks will affect, for example, the identification of the pitch between the stripes.

Figure 8:
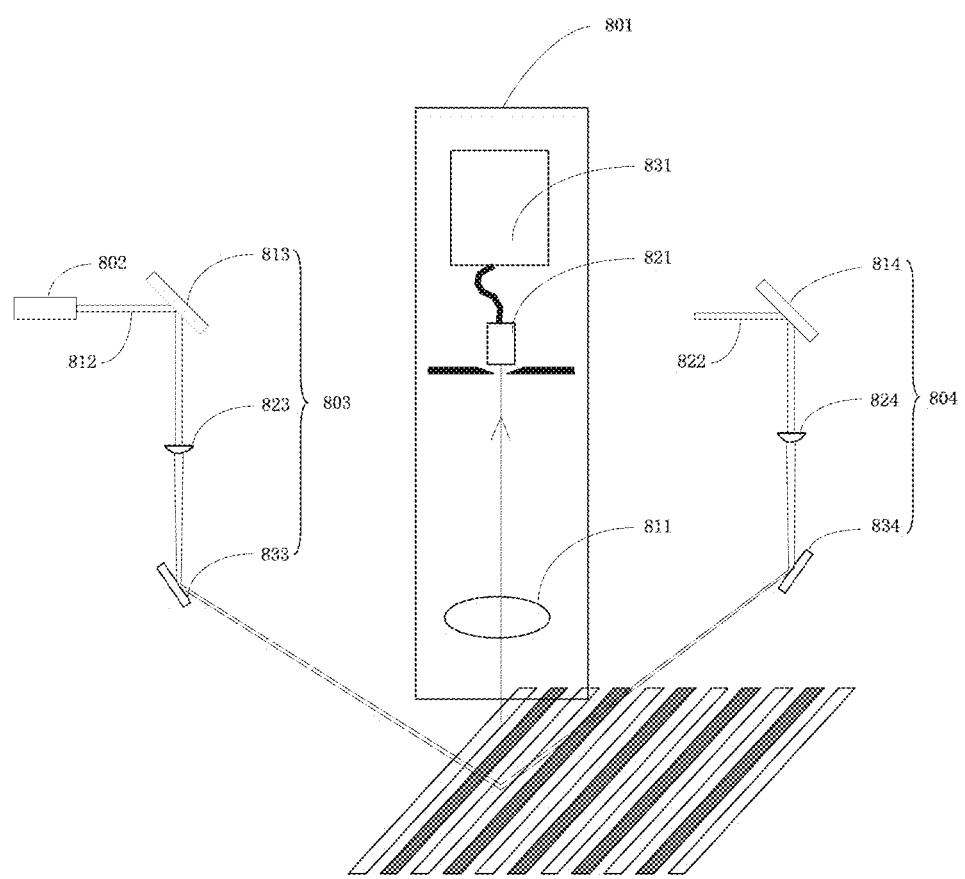
FIG. 8 is a side view in partial cross section of a structure of an optical image detection device according to another embodiment of the present disclosure.

To overcome this problem, embodiments of the present disclosure also provide another detection unit. FIG. 8 is a schematic view of a structure of a detection unit according to another embodiment of the present disclosure. Referring to FIG. 8, the detection unit may include an optical detection system 801, a light source 802, a first light generation member 803 for generating first light, a second light generation member 804 for generating second light. These components will be described in detail below.

Optical detection system 801 includes a lens 811 and a transducer 821 (e.g., a photodiode). Lens 811 is configured to converge light emitted from marks and direct the converged light to transducer 821. Transducer 821 is configured to receive the converged light and convert the received light into an electrical signal.

Light source 802 is configured to generate a first light beam 812 and a second light beam 822.

First light generation member 803 is disposed on one side of optical detection system 801 and includes a first mirror 813, a first lens 823, and a second mirror 833. First mirror 813 is configured to reflect first light beam 812. First lens 823 is configured to converge the reflected first light beam. Second mirror 833 is configured to reflect the converged first beam as a first incident light onto the marks at a first oblique angle.

Second light generation member 804 is disposed on the other side of optical detection system 801 opposite first light generation member 803 and includes a third mirror 814, a second lens 824, and a fourth mirror 834. Third mirror 814 is configured to reflect second light beam 822. Second lens 824 is configured to converge the reflected second light beam. Fourth mirror 834 is configured to reflect the converged second beam as a second incident light onto the marks at a second oblique angle. In one embodiment, the first and second oblique angles have the same angle.

In one embodiment, the detection apparatus may further include a data acquisition module 831 for acquiring the electrical signal of transducer 821 and transmit the acquired electrical signal to a data processing device for further processing.

The detection unit shown in FIG. 8 can be used for dark field detection. Under normal circumstances, when the incident light irradiates the marks at an oblique angle, the optical detection system cannot receive the reflected light or can only receive a small amount of light, the field of view is generally dark and is referred to as a dark field detection.

And if the marks have defects, the incident light will be scattered, and the scattered light will be condensed by the lens. The transducer will pick up the condensed light, convert it to an electrical signal, and send the electrical signal to the image processing unit for further processing to detect defects of the marks. Further, the symmetrical positon of the first and second light beams with respect to the detection unit can reduce the adverse effects on the detection results caused by the lens distortion.

In some embodiments, the detection apparatus may be provided with the detection unit shown in FIG. 7 for detecting a defect-free mark. In some other embodiments, the detection apparatus may be provided with the detection unit shown in FIG. 8 for detecting a defective mark. In further embodiments, a portion of the detection device may be provided with the detection unit shown in FIG. 7 and another portion of the detection device may be provided with the detection unit shown in FIG. 8 so as to operate in a complementary manner.

Thus, according to embodiments of the present disclosure, defects of a mark can be detected, and if the mark is defective, the desired information can still be obtained form the mark.

Embodiments of the present disclosure also provide a detection device for detecting a mark on a substrate. The detection device may include any one of the above-described embodiments.

In one embodiment, the detection device may also include a substrate support platform for supporting a substrate. In one embodiment, the detection device may also include a vibration-proof platform for supporting a substrate and for detecting marks on the substrate.

Embodiments of the present disclosure also provide a method for detecting a mark on a substrate. The method may be implemented using the above-described embodiments for detecting a mark on a substrate. The mark may include a plurality of first stripes (a first stripe group) and a plurality of second stripes (a second stripe group) that are arranged substantially parallel to each other and spaced apart from each other. The method may include the following steps:

Step S1: providing a substrate, which can be a silicon wafer having the above-described mark.

Step S2: providing a detection module. The detection module can be moved over a surface of the substrate along at least one direction (e.g., along the above-described X or Y direction). The detection module includes at least one detection unit and at least one positioning unit. The detection unit is configured to obtain information from a corresponding mark; the detection unit is also configured to be able to perform a repeated acquisition operation to obtain information from the first stripes and from the second stripes, respectively. Each acquisition operation obtains information from the first stripes or from the second stripes in the corresponding mark. The positioning unit is configured to support and position a corresponding detection unit.

Step S3: operating the positioning unit to align the detection unit with a corresponding mark along a certain direction (e.g., along the Y direction).

Step S4: driving the detection module in the certain direction to detect the mark.

In the embodiment, it is possible to substantially align the detection unit with a corresponding mark that is to be detected by operating the positioning unit, thereby driving the detection module to move over the surface of the substrate to detect a corresponding mark. The method for detecting a mark according to embodiments of the present disclosure does not rely on an optical imaging technique, so that there is no need to place the mark to the center of the field of view, there is no need for a fine adjustment operation, and there is no need to identify the optical image, thereby reducing the mark detection time. The method also eliminates the high precision alignment accuracy required in the prior art approaches. Thus, the mark detection cost is reduced, and the efficiency and throughput of the detection device are improved.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. An apparatus for detecting a plurality of marks on a substrate, each of the marks having a first stripe group and a second stripe group spaced apart from each other and disposed in parallel to each other, the apparatus comprising:
   at least one detection module moveable over a surface of the substrate along a first direction and a second direction perpendicular to the first direction, the at least one detection module comprising:
      at least one detection unit configured to obtain data from a mark and operable to perform repeated acquisition operations on the first stripe group and the second stripe group of the mark, each of the acquisition operations acquiring data associated with the first stripe group or the second stripe group of the mark;
      at least one positioning unit comprising at least one support rail and configured to align the at least one detection unit with the mark in the first direction;
      a frame comprising a first bracket and a second bracket disposed opposite to each other; and
      an air cushion guide comprising:
         a first rail extending in the second direction;
         a first slider engaged with the first rail and configured to support the first bracket;
         a second rail extending in the second direction; and
         a second slider engaged with the second rail and configured to support the second bracket,
   wherein the first slider when moving along the first rail drives the first bracket along the second direction and the second slider when moving along the second rail drives the second bracket along the second direction, so that the detection module moves above the surface of the substrate in the first direction and in the second direction, wherein the at least one positioning unit further comprises a positioning mechanism configured to move the at least one detection unit along the at least one support rail to a desired position to align the at least one detection unit with a mark, wherein the at least one detection unit comprises first and second holes arranged vertically with respect to each other and a third hole disposed between the first and second holes, the third hole having an internal thread, and a screw rod having an external thread engaging the internal thread of the third hole, the screw rod passing through the third hole drives the at least one detection unit along the at least one support rail when rotating, and wherein the at least one support rail is mounted to the frame and comprises a first support rail passing through the first hole and a second support rail passing through the second hole and suspended between the first and second brackets.

2. The apparatus of claim 1, wherein the first stripe group comprises a plurality of first stripes, and the second stripe group comprises a plurality of second stripes, the first and second stripes are spaced apart from each other and disposed in parallel to each other along the first direction.

3. The apparatus of claim 2, wherein the first stripes and the second stripes are alternately arranged with each other.

4. The apparatus of claim 1, further comprising:
a data processing module configured to determine a positional deviation between the first and second stripe groups based on the data obtained from the first and second stripe groups.

5. The apparatus of claim 1, wherein the obtained data comprises a peak light intensity received from the first stripe group or from the second stripe group and a time associated with the received peak light intensity.

6. The apparatus of claim 1, wherein:
the plurality of marks comprise a plurality of columns of marks arranged along the first direction;
the at least one detection unit comprising a plurality of detection units;
the at least one positioning unit comprising a plurality of positioning units, each of the positioning units operative to align one of the detection units with a corresponding mark arranged along the first direction.

7. The apparatus of claim 1, wherein the positioning mechanism drives the at least one detection unit using the screw rod.

8. The apparatus of claim 1, wherein the frame further comprises:
a third bracket engaged with a first end of the first bracket and a first end of second bracket; and
a fourth bracket opposite the third bracket and engaged with a second end of the first bracket and a second end of the second bracket.

9. The apparatus of claim 1, wherein the marks are disposed in a scribe line extending along the first direction; and
the marks are configured such that, when a placement error of the substrate is a first error, and a misalignment of a center of a field of view of the at least one detection unit with respect to an ideal center axis of the scribe line is a second error, the at least one detection unit is configured to obtain data from the marks disposed in the scribe line.

10. The apparatus of claim 1, wherein the at least one detection unit comprises an optical image detection system, the optical image detection system comprising:

a light source for generating light;
a lens configured to converge the light generated by the light source to irradiate the marks;
a semi-reflective mirror configured to reflect at least one portion of the light toward the lens to irradiate the marks and transmit at least one portion of the light emitted by the irradiated marks through the lens; and
a transducer configured to receive the emitted portion of the light by the irradiated marks through the lens by the semi-reflective mirror and convert the received emitted portion of the light into an electrical signal.

11. The apparatus of claim 10, wherein the at least one detection unit further comprises:
a data acquisition module for acquiring the electrical signal of the transducer and providing the acquired electrical signal to a data processing device for processing.

12. The apparatus of claim 1, wherein the at least one detection unit comprises an optical image detection system, the optical image detection system comprising:
a lens for converging light emitted from the marks;
a transducer for receiving light from the lens and converting the received light into an electrical signal;
a light source for generating a first light beam and a second light beam;
a first light generating member disposed on a first side of the optical image detection system and comprising:
a first mirror for reflecting the first light beam;
a first lens for converging the first light beam reflected by the first mirror to generate a converged first light beam;
a second mirror for reflecting the converged first light beam to be incident onto the mark at a first oblique angle;
a second light generating member disposed on a second side of the optical image detection system opposite the first side and comprising:
a third mirror for reflecting the second light beam;
a second lens for converging the second light beam reflected by the third mirror to generate a converged second light beam; and
a fourth mirror for reflecting the converged second light beam to be incident onto the mark at a second oblique angle.

13. The apparatus of claim 1, wherein the marks are marks etched into the substrate, and the first stripe group comprises etched marks of a current layer, and the second stripe group comprises etched marks of a previous layer.

14. The apparatus of claim 1, wherein the at least one detection module uniformly accelerates or uniformly decelerates over the surface of the substrate along the first direction.

15. The apparatus of claim 1, further comprising a substrate support platform for supporting the substrate.

16. The apparatus of claim 15, further comprising a vibration-proof platform for supporting the substrate support platform.

17. A method for detecting a mark on a substrate, the mark comprising a first stripe group and a second stripe group arranged in parallel to each other, the method comprising:
providing a detection module having a detection unit and a positioning unit comprising a support rail configured to support the detection unit, the detection module being disposed over a surface of the substrate, the detection module configured to move over the surface of the substrate in a first direction and a second direction perpendicular to the first direction to obtain data of the mark;

aligning the detection unit with the mark by the positioning unit; and operating the detection module to detect the mark, wherein the detection unit comprises first and second holes arranged vertically with respect to each other and a third hole disposed between the first and second holes, the third hole having an internal thread, and a screw rod having an external thread engaging the internal thread of the third hole, wherein the detection module further comprises:
a positioning unit comprising at least one support rail and configured to align the detection unit with the mark in the first direction;
a frame comprising a first bracket and a second bracket disposed opposite to each other;
an air cushion guide comprising:
a first rail extending in the second direction;
a first slider engaged with the first rail and configured to support the first bracket;
a second rail extending in the second direction; and
a second slider engaged with the second rail and configured to support the second bracket, wherein the first slider when moving along the first rail drives the first bracket along the second direction and the second slider when moving along the second rail drives the second bracket along the second direction, so that the detection module moves above the surface of the substrate in the first direction and in the second direction, wherein the positioning unit further comprises a positioning mechanism configured to move the detection unit along the at least one support rail to a desired position to align the detection unit with a mark, wherein the detection unit comprises first and second holes arranged vertically with respect to each other and a third hole disposed between the first and second holes, the third hole having an internal thread, and a screw rod having an external thread engaging the internal thread of the third hole, the screw rod passing through the third hole drives the detection unit along the at least one support rail when rotating, and wherein the at least one support rail is mounted to the frame and comprises a first support rail passing through the first hole and a second support rail passing through the second hole and suspended between the first and second brackets.

\* \* \* \* \*